United States Patent [19]

Vora

[11] Patent Number: 5,055,418

[45] Date of Patent: Oct. 8, 1991

[54] PROCESS FOR FABRICATING COMPLEMENTARY CONTACTLESS VERTICAL BIPOLAR TRANSISTORS

[75] Inventor: Madhukar B. Vora, Los Gatos, Calif.

[73] Assignee: National Semiconductor Corporation, Santa Clara, Calif.

[21] Appl. No.: 614,182

[22] Filed: Nov. 13, 1990

Related U.S. Application Data

[62] Division of Ser. No. 401,523, Aug. 29, 1989, Pat. No. 5,014,107.

[51] Int. Cl.[5] .......................................... H01L 21/265
[52] U.S. Cl. ...................................... 437/31; 437/33; 437/67; 437/151; 437/909; 148/DIG. 10; 148/DIG. 11
[58] Field of Search .................. 437/31, 33, 32, 54, 437/909, 917; 148/DIG. 10, DIG. 11; 357/44

[56] References Cited

U.S. PATENT DOCUMENTS

| | | | |
|---|---|---|---|
| 3,868,722 | 2/1975 | Le Can et al. | 148/DIG. 85 |
| 3,909,318 | 9/1975 | Le Can et al. | 148/DIG. 85 |
| 4,038,680 | 7/1977 | Yagi et al. | 357/44 |
| 4,076,556 | 2/1978 | Agraz-Guerena et al. | 148/DIG. 85 |
| 4,110,782 | 8/1978 | Nelson et al. | 357/34 |
| 4,214,315 | 7/1980 | Anantha et al. | 357/44 |
| 4,357,622 | 11/1982 | Magdo et al. | 437/27 |
| 4,719,185 | 1/1988 | Goth | 437/33 |

OTHER PUBLICATIONS

New Technology for High-Power IC, IEEE Transactions on Electron Devices, Jan. 1971, pp. 45-49, Kobayashi.

Primary Examiner—Brian E. Hearn
Assistant Examiner—Michael Trinh
Attorney, Agent, or Firm—Townsend and Townsend

[57] ABSTRACT

A complementary NPN and PNP contactless vertical transistor structure is formed by a process that includes the steps of providing: (1) a buried layer and P— tub for NPN; (2) a channel stopper for NPN, and a buried layer for PNP; (3) isolation oxide for NPN and PNP; (4) a sink for NPN, and a ground for PNP; (5) a base for NPN, and a sink for PNP; (6) a base for PNP; (7) a N+ poly implant for NPN emitter and PNP extrinsic base; (8) a P+ poly implant for NPN extrinsic base and PNP emitter; (9) poly definition; (10) silicide exclusion for resistors and diodes; (11) contacts; (12) first metal; (13) vias; (14) second metal; and (15) scratch protection.

10 Claims, 3 Drawing Sheets

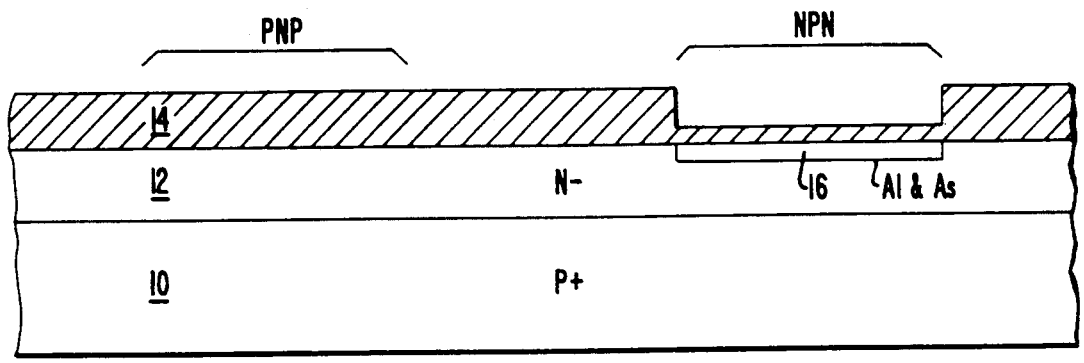
FIG._1.
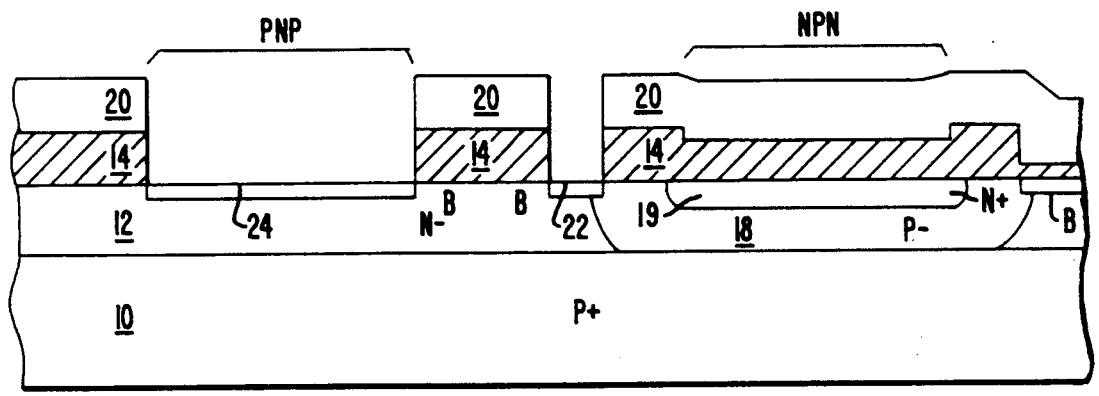
FIG._2.
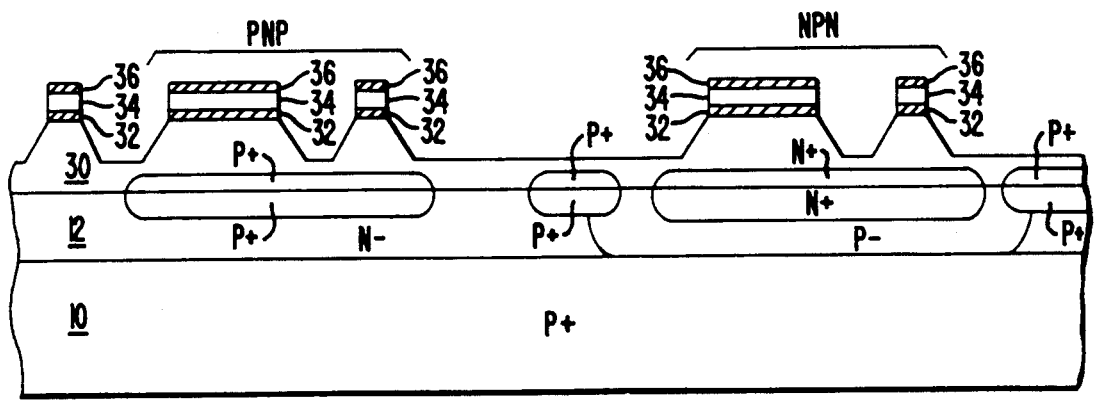
FIG._3.

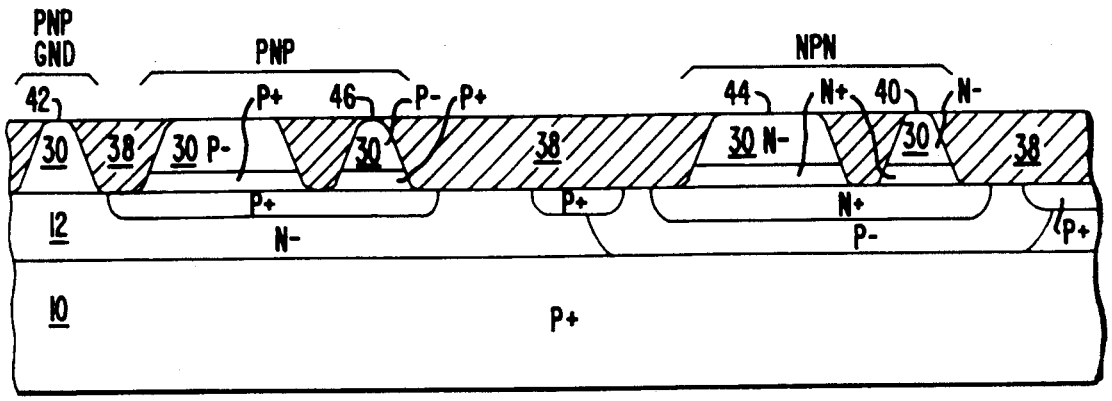
FIG._4.
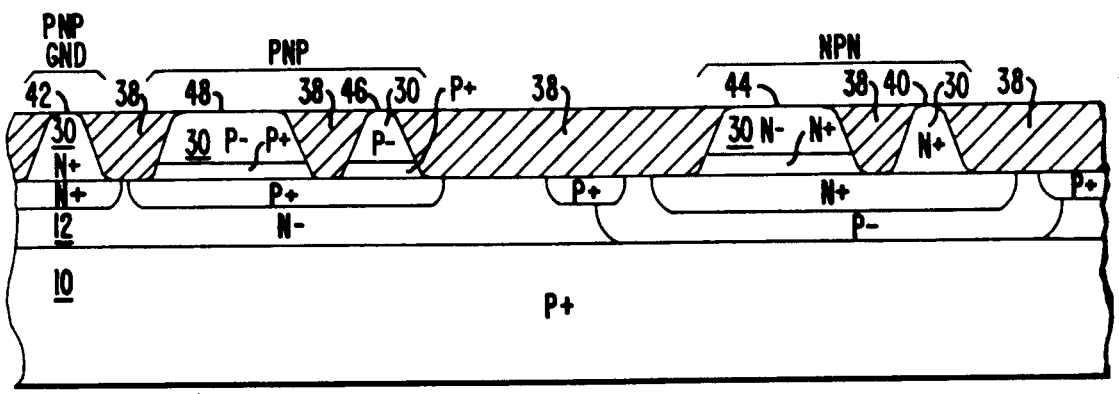
FIG._5.
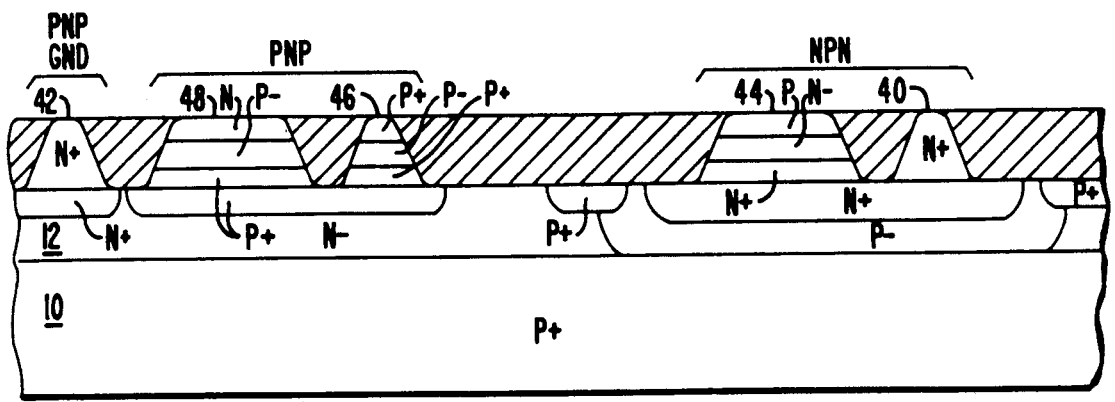
FIG._6.

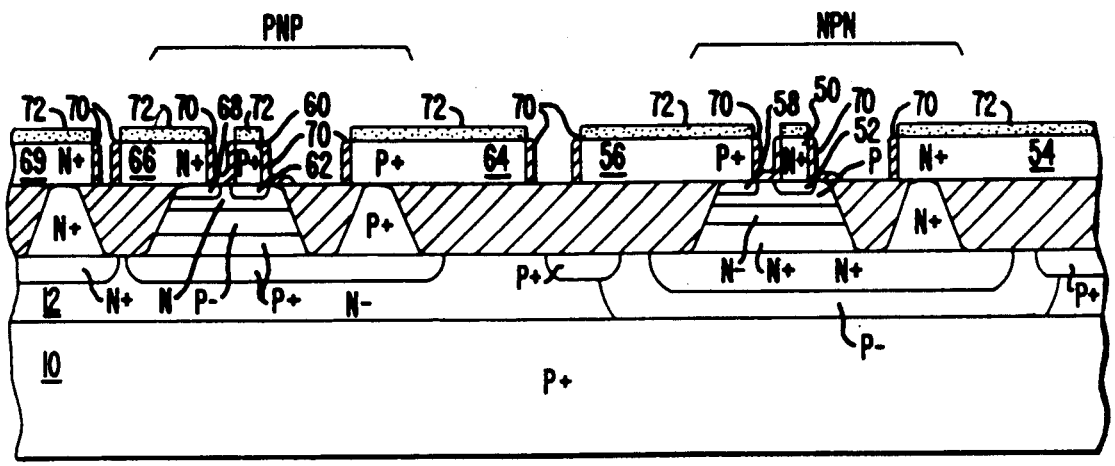
FIG._7.
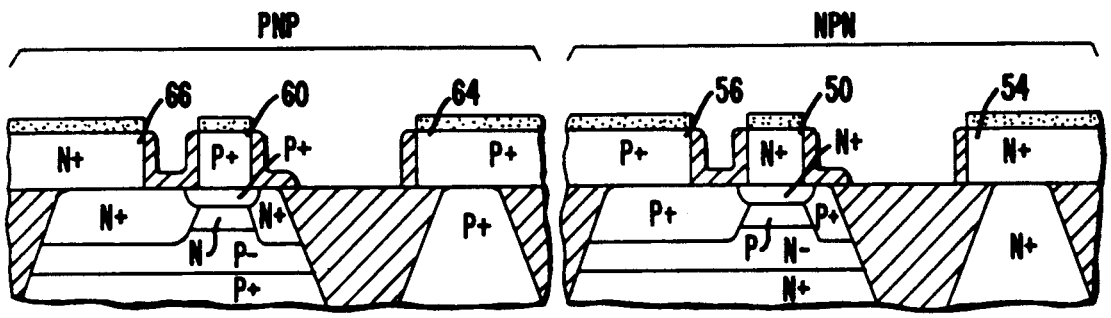
FIG._8A.  FIG._8B.

PROCESS FOR FABRICATING COMPLEMENTARY CONTACTLESS VERTICAL BIPOLAR TRANSISTORS

This is a Division of application Ser. No. 401,523 filed Aug. 29, 1989, now U.S. Pat. No. 5,014,107.

BACKGROUND OF THE INVENTION

This invention relates to integrated circuit fabrication processes, and more particularly to a method of providing complementary contactless vertical bipolar transistors.

Recent developments in contactless bipolar transistor technology make possible smaller bipolar devices with simplified interconnect structures, thereby reducing power consumption and increasing yield. These developments include the use of polysilicon for the emitter structure, which permits the fabrication of extremely shallow emitters; the use of composed masking, in which critical spacings between the base and emitter are defined in the polysilicon at the same mask level; the use of polysilicide instead of the conventional copper-doped aluminum for emitter interconnect, which provides thin reliable current carriers; and the use of a high degree of self-alignment, by which, for example, the polysilicide covering the base, emitter and collector regions is aligned to the polysilicon features, and the n+ polysilicon is aligned to the emitter.

The developments recited above are described in U.S. Pat. No. 4,609,568, issued Sept. 2, 1986 to Koh et al., which teaches a process for fabricating self-aligned regions of metal silicide on bipolar integrated circuits having self-aligned polysilicon emitter and base contacts. Polysilicon is deposited on the silicon substrate, then suitably doped and coated with a layer of protective nitride. After a process sequence involving an oxidation mask (also known in the art as a silicide exclusion mask) and a poly definition mask, base, emitter and collector contacts are formed in the polysilicon, and polysilicon areas from which silicide is to be excluded are defined. Subsequently, (a) a thermal drive-in step forms a base and emitter self-aligned to their respective polysilicon contacts; and (b) a thermal oxidation step passivates the active areas and form an oxide over areas from which silicide is to be excluded, whereby a self-aligned silicide can be formed over all exposed poly.

Unfortunately, the need remains for a bipolar process that provides either vertical NPN transistors, vertical PNP transistors, or both while retaining the advantages of a poly emitter, composed poly definition mask, silicide interconnect system, and self-aligned features, all without involving an excessive number of masking steps.

SUMMARY OF THE INVENTION

An object of the present invention is to provide a single process suitable for forming NPN contactless vertical transistors, PNP contactless vertical transistors, or both.

This and other objects are achieved by the sequence of process steps summarized below in Table 1. The columns marked "NPN Devices" and "PNP Devices" describe the purpose for the masking step in the fabrication of the respective devices.

TABLE 1

| Mask | NPN Devices | PNP Devices |
|------|-------------|-------------|
| 1 | Buried Layer & P— Tub | — |
| 2 | Channel Stopper | Buried Layer |
| 3 | Isolation Oxide | Isolation Oxide |
| 4 | Sink | Ground |
| 5 | Base (NPN only) | Sink |
| 6 | — | Base (PNP only) |
| 7 | N+ Poly Implant (NPN emitter) | N+ Poly Implant (PNP extrinsic base) |
| 8 | P+ Poly Implant (NPN extrinsic base) | P+ Poly Implant (PNP emitter) |
| 9 | Poly Definition | Poly Definition |
| 10 | Silicide Exclusion (for resistor & diode) | Silicide Exclusion (for resistor & diode) |
| 11 | Contact | Contact |
| 12 | First Metal | First Metal |
| 13 | Via | Via |
| 14 | Second Metal | Second Metal |
| 15 | Scratch Protection | Scratch Protection |

Excellent quality NPN transistors can be produced without masking step number 6; hence, the process for forming both NPN and PNP transistors requires only one additional masking step. In addition to masking step number 6, the complementary bipolar process of the present invention includes two additional implants beyond that required for the NPN process alone: an aluminum implant for forming the p- well, and a n-type implant for forming the base of the PNP transistor.

Moreover, the fabrication of only PNP transistors does not require masking step 5.

The present invention provides, in addition to vertical NPN transistors, vertical PNP transistors rather than lateral PNP transistors. Generally, a vertical transistor is superior to a lateral transistor due to, among other reasons, better collection of carriers. Hence, a process providing complementary lateral PNP transistors and vertical NPN transistor may be suitable only for applications which are tolerant of the performance degradation imposed by the lateral transistors.

BRIEF DESCRIPTION OF THE DRAWINGS

In the drawings, where like reference characters indicate like parts,

FIG. 1 is a cross section of an integrated circuit structure illustrating a substrate upon which a doped epitaxial layer and an oxide layer are formed, and the oxide layer defined for the buried layer and P- tub of the NPN transistor;

FIG. 2 is a subsequent cross section view after further definition of the oxide layer for a channel stopper for the NPN transistor, and a buried layer for the PNP transistor;

FIG. 3 is a subsequent cross section view after definition of isolation islands;

FIG. 4 is a subsequent cross section view after formation of field oxide;

FIG. 5 is a subsequent cross section view after formation of a sink for the NPN transistor, and a ground for the PNP transistor;

FIG. 6 is a subsequent cross section view after formation of a base for the NPN transistor, and a sink and base for the PNP transistor;

FIG. 7 is a subsequent cross section view after poly definition and silicide formation; and FIG. 8 is a cross section view after an alternative poly definition and silicide formation process sequence.

DETAILED DESCRIPTION OF THE PREFERRED EMBODIMENT

In fabricating the complementary vertical bipolar transistors of the present invention, one preferably selects as the starting material a silicon substrate 10 having a high conductivity. As will become apparent below, the high conductivity feature is desirable because the substrate will function as the ground tap for the NPN transistor. A suitable starting material is a p-type silicon wafer having the orientation <100> and a resistivity of about 0.001 ohm-centimeter. For purposes of the present invention, silicon substrate 10 is provided with a first n-type epitaxial layer 12 thereon; see FIG. 1. An epitaxial layer 12 of thickness 5 microns and doped with phosphorus at a concentration of $1 \times 10^{15}$ atoms/cm$^3$ is suitable.

A p- tub and a buried layer for the NPN transistor are formed in the next process sequence; the resulting structure is shown in FIG. 1. A thermal silicon dioxide layer 14 of about 5000 Angstroms in thickness is formed on the upper surface of the epitaxial layer 12. A layer of photoresist (not shown) is deposited and suitably patterned in a first masking step, followed by a plasma etch of the oxide over region 16 of the epitaxial layer 12. The resist is stripped, and a thin protective thermal oxide of about 100 Angstroms is grown over the epitaxial region 16. A fast diffusing p-type impurity such as aluminum and a slower diffusing n-type impurity such as arsenic are introduced into the epitaxial region 16 through the thin overlying oxide, under such conditions of dose, energy and anneal time so that a suitable dopant profile is achieved A satisfactory anneal for the aluminum-arsenic implant is 1100° C. for one hour. The desired profile (refer to FIG. 2) is a p- well 18 having a substantially uniform concentration of $2 \times 10^{15}$ atoms/cm$^3$, which is formed by the quickly diffusing aluminum dopant The slower arsenic dopant diffuses to a much lesser extent, as indicated by region 19. The arsenic implant is made, for example, at a dose in the range of $1 \times 10^{15}$ to $1 \times 10^{16}$ ions/cm$^2$ at an energy of 100 keV.

A channel stopper for the NPN transistor and the buried layer for the PNP transistor are formed in the next process sequence; the resulting structure is shown in FIG. 2. A layer of photoresist 20 is deposited and suitably patterned in a second masking step, followed by a plasma etch of the oxide over epitaxial region 22 to accommodate formation of the channel stopper, and epitaxial region 24 to accommodate formation of the PNP transistor buried layer. A p-type dopant such as boron is introduced into the epitaxial regions 22 and 24. A suitable implant dose is $1 \times 10^{15}$ ions/cm$^2$ at about 50 keV; a suitable anneal is at 1000 degrees C. for thirty minutes.

Isolation islands are fabricated in the next process sequence; the resulting structure is shown in FIG. 3. Photoresist 20 and oxide 14 are stripped, and an undoped epitaxial layer 30 is grown over n-type epitaxial layer 12 to a thickness of from one to two microns. Epitaxial layer 30 is oxidized, thereby forming an oxide layer 32 about 200 Angstroms thick on the surface. About 1500 Angstroms of nitride are deposited (layer 34) and oxidized at 1000 degrees C. for 45 minutes to grow a thin oxide 36 on the upper surface of the nitride layer 34.

A layer of photoresist (not shown) is applied and suitably patterned in a third masking step (isolation mask), followed by an etching of the oxide-nitride-oxide layers 32, 34 and 36. The oxide layers 32 and 36 are etched using a 6:1 BOE etch or any suitable plasma etch. The nitride layer 34 is etched using a suitable plasma. Using the oxide-nitride-oxide 32-34-36 sandwich as a mask, the epitaxial layer 30 is etched in KOH to a depth of 6000-7000 Angstroms to form the isolation islands and sinks for the PNP and NPN transistors, as well as the ground contact (+5 volts) for the PNP transistor.

Field oxide 38 is grown and the wafer planarized; the resulting structure is shown in FIG. 4. For example, the oxide may be grown at 1000 degrees C. for 20 minutes at about 25 atmospheres to produce an oxide of suitable thickness. The remaining sections of layers 32, 34 and 36 are suitable stripped.

The isolation technique described herein is substantially similar to that taught in U.S. Pat. No. 3,648,125, issued Mar. 7, 1972 to Peltzer, which is commonly known as the Isoplanar technique. Any resulting "bird's head" is removed and the structure planarized by any suitable technique; an example is taught in U.S. Pat. No. 4,539,744, issued Sept. 10, 1985 to Burton, which hereby is incorporated herein by reference.

The sink of the NPN transistor and the ground of the PNP transistor are formed in the next process sequence; the resulting structure is shown in FIG. 5. Photoresist is applied to the surface of the structure shown in FIG. 4 and patterned in a fourth masking step to expose sink region 40 and PNP ground region 42 A suitable n-type dopant such as phosphorus is implanted at a dose of $1 \times 10^{16}$ ions/cm$^2$ with an energy of 150 keV, and the wafer is annealed at, for example, 1000 degrees C. for 30 minutes in a N$_2$ ambient.

The base of the NPN transistor is formed in the next process sequence; the sink for the PNP transistor also is completed at this time A layer of photoresist (not shown) is deposited and suitably patterned in a fifth masking step to accommodate the implant of a suitable p-type dopant such as boron into the region 44 (FIG. 5) of the NPN transistor to form a base, and into the sink region 46 (FIG. 5) of the PNP transistor. Boron is implanted at a dose of from $5 \times 10^{12}$ to $5 \times 10^{13}$ ions/cm$^2$ with an energy up to about 100 keV, and the wafer is annealed at, for example, 1000 degrees C. for 30 minutes in a N$_2$ ambient. A NPN base width of between 1000 and 4000 Angstroms is satisfactory.

The base of the PNP transistor is formed in the next process sequence. A layer of photoresist (not shown) is deposited and suitably patterned in a sixth masking step to accommodate the implant of a suitable n-type dopant such as arsenic into the region 48 (FIG. 5) of the PNP transistor to form a base. Arsenic is implanted at a dose of $5 \times 10^{13}$ ions/cm$^2$ with an energy of 150 keV, and the wafer is annealed at, for example, 950 degrees C. for 10 to 15 minutes in a N$_2$ ambient. A PNP base width of between 1000 and 2000 Angstroms is satisfactory.

The structure resulting from the fifth and sixth masking steps is shown in FIG. 6.

The seventh, eighth, ninth and tenth masking steps are provided for doping and patterning a polysilicon layer to form interconnections and emitters, substantially in accordance with U.S. Pat. No. 4,609,568, issued Sept. 2, 1986 to Koh et al., which hereby is incorporated herein by reference. A layer of polycrystalline silicon of desired thickness is deposited by, for example, chemical vapor deposition. Using well known photolithographic techniques in conjunction with diffusion or ion implantation processes, selected impurity types are introduced into selected regions of the polysilicon layer. In the seventh masking step, a suitable n-type implant is made for forming the emitter interconnect line 50, the emitter 52, and the collector interconnect line 54 of the NPN transistor, and the base interconnect line 66 and extrinsic base 68 of the PNP transistor. The implant for the ground interconnect line 69 of the PNP transistor also is made at this time. In the eighth masking step, a suitable p-type implant is made for forming the emitter interconnect line 60, the emitter 62, and the collector interconnect line 64 of the PNP transistor, and the base interconnect line 56 and extrinsic base 58 of the NPN transistor. Masking steps nine and ten implement a silicide exclusion technique for define resistors and diodes and patterning the polysilicon layer. The pattern and arrangement of the resulting doped regions is selected in accordance with the desired active and passive devices being fabricated. The order of the masking steps for the silicide exclusion technique taught in the aforementioned Koh et al. patent may be reversed if desired. The remaining silicon nitride is stripped and a silicide formed over the interconnect lines; a satisfactory technique is taught in U.S. Pat. No. 4,567,058, issued Jan. 28, 1986 to Koh. The resulting structure is shown in FIG. 7.

The silicide exclusion technique specific to the present invention now is described in detail. About 1000 Angstroms of $Si_3N_4$ are deposited over a thin oxide overlying the polysilicon layer. The wafer is annealed at about 800° C. or 900° C. for 30 minutes to distribute the dopant in the polysilicon layer. A layer of photoresist (not shown) is deposited and suitably patterned in masking step 9 to define the polysilicon layer in a desired interconnect pattern for the NPN and PNP transistors. The resistors and diodes remain masked. The nitride, oxide and polysilicon are etched with suitable plasmas, and the residual resist is stripped in an $O_2$ plasma. Another layer of photoresist (not shown) is deposited and suitably patterned in masking step 10 to permit removal of the nitride and thin oxide, as described above, over the resistors and diodes. When the residual resist is stripped in an $O_2$ plasma etch, nitride remains only in those areas where silicide is to be formed. An anneal is performed at this time to diffuse dopants from the polysilicon lines 50, 54, 56, 60, 64, 66, and 69 into underlying epitaxial regions, thereby forming, for example, the emitter 52 and extrinsic base 58 of the NPN transistor, and the emitter 62 and extrinsic base 68 of the PNP transistor. An anneal temperature of 950° C. for 30 minutes is satisfactory. The structure is subject to a thermal oxidation at, for example, 850° C. to 1000° C. for from 10 to 60 minutes as appropriate to passivate all polysilicon and epitaxial silicon areas with oxide 70; silicide is to be excluded from these areas.

In one variation, the extrinsic bases for the NPN and PNP transistors are extended substantially in accordance with the teachings set forth in U.S. patent application Ser. No. 834,926, filed Feb. 28, 1986 in the name of Vora, which hereby is incorporated herein by reference This variation results in a significantly lower base resistance, and hence improved transistor performance Specifically, polysilicon definition masking step 9 is replaced by two masking steps 9A and 9B, which use separate polysilicon definition masks for the NPN and PNP transistors. As taught above, silicon nitride is deposited over a thin oxide overlying the polysilicon layer, and annealed A layer of photoresist (not shown) is deposited and suitably patterned in masking step 9A to define the interconnect pattern for the NPN transistors. The PNP transistors, diodes, and resistors remain masked. The nitride and oxide, and then the polysilicon, are etched as described above, which exposes portions of region 44 about the NPN emitter interconnect line 50. An extrinsic NPN base implant is made using a p-type impurity such as boron An implant of $BF_2$ at a dose of $4 \times 10^{14}$ ions/cm$^2$ and an energy of 40 keV is satisfactory. The residual resist is stripped in an $O_2$ plasma. Another layer of photoresist (not shown) is deposited and suitably patterned in masking step 9B to define the interconnect pattern for the PNP transistors. The NPN transistors, diodes, and resistors remain masked. The nitride and oxide, and then the polysilicon, are etched as described above, which exposes portions of region 48 about the PNP emitter interconnect line 60. An extrinsic PNP base implant is made using a n-type impurity such as phosphorus; a dose of $1 \times 10^{14}$ to $5 \times 10^{14}$ ions/cm$^2$ at an energy of from 40-80 keV is satisfactory. The residual resist is stripped in an $O_2$ plasma, and processing continues as described above with respect to masking step 10. The resulting structure is shown in relevant part in FIG. 8 (expanded scale).

Additional masking steps are provided for forming contact holes (mask 11), patterning first metal (mask 12), forming via holes (mask 13), patterning second metal (mask 14), and furnishing scratch protection (mask 15). Suitable techniques are well known in the art.

While the invention has been described with reference to a particular embodiment, one will appreciate that the embodiment is illustrative only and that the invention is not intended to be limited to the particular embodiment. Variations and combinations within the spirit and scope of the invention are contemplated as well. For example, although specific materials, doses, temperatures, thicknesses and periods have been described, these are set forth to enable a full understanding of the invention, not to limit the invention. Moreover, one will appreciate that the performance of the transistors of the invention may be improved by providing additional structural features or alternative doping profiles, which in some cases will complicate the process with one or more additional masking steps. An example of this is the extension of the extrinsic bases of the NPN and PNP transistors taught above with reference to the Vora 834,926 application, which requires only a single additional masking step. Also, other interconnect techniques such as taught in U.S. patent application Ser. No. 817,231, filed Jan. 8, 1986 in the name of Vora et al. patents, may be used with the invention. Accordingly, these and other variations are contemplated herein and are to be considered within the scope of the present invention.

What is claimed is:

1. A process for fabricating complementary vertical bipolar transistors on a semiconductor substrate of a first conductivity type, comprising the steps of:

forming a first epitaxial layer of an opposite conductivity type on said substrate;

introducing into a first region of said first epitaxial layer a fast diffusing dopant of the first conductivity type to form a well, and a slower diffusing dopant of the opposite conductivity type to form a buried layer in said well;

introducing into a second region of said first epitaxial layer a dopant of the first conductivity type to form a buried layer;

forming a second epitaxial layer on said first epitaxial layer;

forming respective epitaxial silicon islands in said second epitaxial layer over said first region and said second region;

forming a polysilicon emitter transistor of a first type in the epitaxial silicon island over said first region; and forming a polysilicon emitter transistor of a second type in the isolation island over said second region, said transistor of the second type being complementary to said transistor of the first type.

2. A process as in claim 1, further comprising the step of doping said substrate to achieve a low resistivity.

3. A process as in claim 2 wherein said fast diffusing dopant is aluminum, further comprising the step of achieving a p-well having a substantially uniform aluminum concentration of $2 \times 10^{15}$ aluminum atoms/cm$^3$ and electrically integrated with said substrate.

4. A process as in claim 3, further comprising the step of doping said substrate to achieve a resistivity of 0.001 ohm-centimeter.

5. A process as in claim 1, wherein said first conductivity type is p-type, said opposite conductivity type is n-type, said first transistor type is NPN, and said second transistor type is PNP.

6. A process for fabricating complementary vertical bipolar transistors on a semiconductor substrate of a first conductivity type, comprising the steps of:

forming a first epitaxial silicon island underlaid by a buried layer of an opposite conductivity type in a well of the first conductivity type within an epitaxial silicon layer upon said substrate, said well being electrically integrated with said substrate;

forming a polysilicon emitter transistor of a first type in said first epitaxial silicon island;

forming a second epitaxial silicon island underlaid by a buried layer of the first conductivity type in a region of said epitaxial silicon layer of the opposite conductivity type; and forming a polysilicon emitter transistor of a second type in said second isolation island, said transistor of the second type being complementary to said transistor of the first type.

7. A process as in claim 6, wherein said substrate is low resistivity.

8. A process as in claim 7, wherein said well is a p-well having a substantially uniform aluminum concentration of $2 \times 10^{15}$ atoms/cm$^3$.

9. A process as in claim 8, wherein the resistivity of said substrate is 0.001 ohm-centimeter.

10. A process as in claim 6, wherein said first conductivity type is p-type, said opposite conductivity type is n-type, said first transistor type is NPN, and said second transistor type is PNP.

* * * * *